(12) United States Patent
Bessios

(10) Patent No.: US 6,606,718 B1
(45) Date of Patent: Aug. 12, 2003

(54) PRODUCT CODE WITH INTERLEAVING TO ENHANCE ERROR DETECTION AND CORRECTION

(75) Inventor: Anthony G. Bessios, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/569,129

(22) Filed: May 11, 2000

(51) Int. Cl.[7] .......................... G06F 11/00; H03M 13/00
(52) U.S. Cl. ....................................... 714/701; 714/804
(58) Field of Search .................................. 714/756, 799, 714/800, 804, 746, 701, 763, 752

(56) References Cited

U.S. PATENT DOCUMENTS

| | | | | |
|---|---|---|---|---|
| 5,455,839 A | * | 10/1995 | Eyuboglu | 375/265 |
| 6,161,209 A | * | 12/2000 | Moher | 714/780 |
| 6,223,322 B1 | * | 4/2001 | Michigami et al. | 714/769 |

* cited by examiner

Primary Examiner—Christine T. Tu
(74) Attorney, Agent, or Firm—Steve Mendelsohn; Ian M. Hughes

(57) ABSTRACT

A product code and interleaving/de-interleaving process are designed to work in combination to improve the coding gain of the product code. Such improvement of coding gain is based on an error constraint. The error constraint is a maximum number of values in error per block in the detected decisions for received output channel samples. The error constraint may be a burst error constraint, such as a maximum number of errors in a block introduced by burst noise in the communication channel; or the error constraint may be an error event constraint, such as the error event generated by an incorrect decision for a path through the trellis of the Viterbi algorithm employed by the detector or a combination of both. In one implementation, a block of data of length N is encoded with a product code of two dimensions with N a positive integer. The product code includes an error correcting capability of detection and correction by a receiver of single one-bit errors in the encoded block. The encoded block of data is interleaved based on an error constraint and the error correcting capability. Interleaving is selected so that de-interleaving by, for example, the receiver distributes the positions of a sequence of up to ER burst errors in rows of the received interleaved values as up to ER one-bit errors along the diagonal direction after de-interleaving. The one-bit errors are separated in distance by the interleaving depth after interleaving, and a priori knowledge of the unique positions along the diagonal direction may be used to resolve positional ambiguities of multiple row- and column-wise parity bit pairs. After de-interleaving, the receiver detects and corrects each one-bit error, and decodes the encoded block by reversing the encoding process of the product code to provide the reconstructed data.

28 Claims, 4 Drawing Sheets

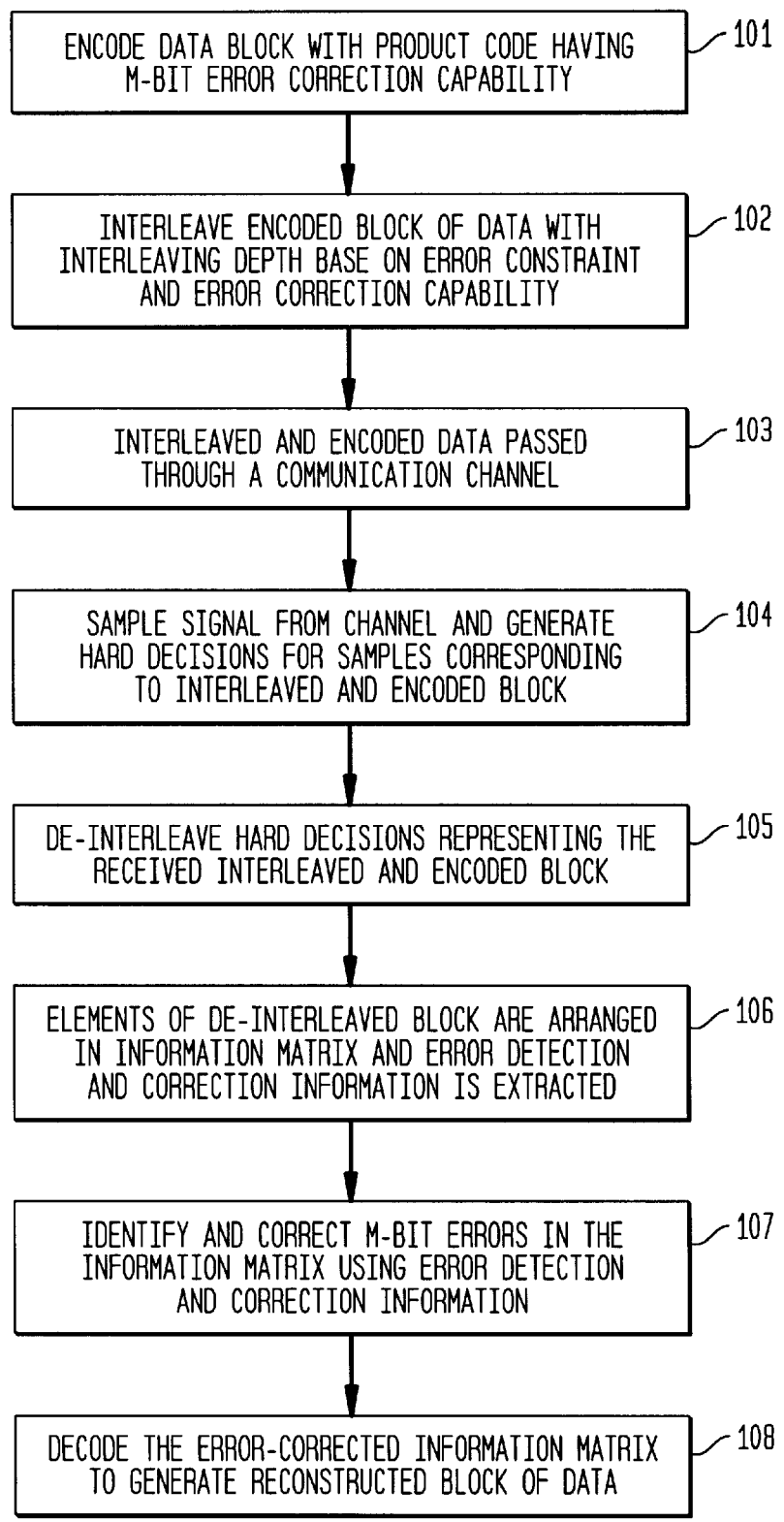

| 1 | 12 | 23 | 34 | 45 | 56 | 67 | 78 | 89 | 100 |
|---|----|----|----|----|----|----|----|----|-----|
| 2 | 13 | 24 | 35 | 46 | 57 | 68 | 79 | 90 | 3 |
| 14 | 25 | 36 | 47 | 58 | 69 | 80 | 91 | 4 | 15 |
| 26 | 37 | 48 | 59 | 70 | 81 | 92 | 5 | 16 | 27 |
| 38 | 49 | 60 | 71 | 82 | 93 | 6 | 17 | 28 | 39 |
| 50 | 61 | 72 | 83 | 94 | 7 | 18 | 29 | 40 | 51 |
| 62 | 73 | 84 | 95 | 8 | 19 | 30 | 41 | 52 | 63 |
| 74 | 85 | 96 | 9 | 20 | 31 | 42 | 53 | 64 | 75 |
| 86 | 97 | 10 | 21 | 32 | 43 | 54 | 65 | 76 | 87 |
| 98 | 11 | 22 | 33 | 44 | 55 | 66 | 77 | 88 | 99 |

PRODUCT CODE WITH INTERLEAVING TO ENHANCE ERROR DETECTION AND CORRECTION

BACKGROUND OF THE INVENTION

1. Field of the Invention

The present invention relates to encoding, detection, and decoding of data in communication systems, and, more particularly, to a product code with interleaving for error detection and correction by a receiver.

2. Description of the Related Art

Many digital transmission systems commonly employ techniques for detection of digital data represented by a sequence of symbols. The symbol bits are transferred as a signal through a transmission (i.e., communication) channel in which noise is typically added to the transmitted signal. For example, magnetic recording systems first encode data into symbol bits that are recorded on a magnetic medium. Writing data to, storing data in, and reading data from the magnetic medium may be considered to take place via a transmission channel that has an associated frequency response. Similarly, wired, optical, wireless, and cellular communication systems also transfer encoded data through a channel that is then detected and decoded by a receiver. The signal may be read from the channel as a sampled signal (i.e., a sequence of sample values) representing the transmitted encoded data. For processing convenience, the encoding and decoding process is applied to blocks of data, each block representing a portion of the original data sequence.

Encoding data with two-dimensional or higher block codes and subsequent decoding of the encoded data are employed in many systems due to the relatively high coding gain and simple structure of the decoder. Product codes may be employed for encoding of data in which two or more simple codes (known as component codes) are combined to create more powerful encoding schemes. The dimension of the code may be related to the number of component codes.

For example, a product code may employ a parity-bit check code that, for the two-dimensional case, encodes N information bits as two-dimensional data words (e.g., $n_1$ words having $n_2$ information bits, or $n_2$ words having $n_1$ information bits). Each data word represents a vector in a corresponding dimension, and $n_1$ and $n_2$ are integers greater than 0. The product code encoding of the data (i.e., the N information bits) are ordered in a rectangular matrix u, and the encoding may be a row vector (e.g., $n_1$ information bits) by column vector (e.g., $n_2$ information bits) combination to form the rectangular matrix u. The combination may be GF(2) addition, multiplication, or linear operation of the binary values. For example, a sequence of N information bits (e.g., a block of data) may be formed as an ($n_1 \times n_2$) matrix of information bits, with $N=n_1 n_2$. The product code encoding of the data also includes row- and column-wise parity bits $p^r$ and $p^c$, respectively, as error detection and correction information. Horizontal rows are formed from $n_2$ code words of an ($n_1$, $k_1$) block code $C^r$ having rate $R_1=(n_1/k_1)$ (here, $k_1$ is the total length of a row, and the length of the parity bit information for each row is $k_1-n_1$). Vertical columns are formed from $n_1$ code words of an ($n_2$, $k_2$) block code $C^c$ having rate $R_2=(n_2/k_2)$ (here, $k_2$ is the total length of a column, and the length of the parity bit information for each column is $k_2-n_2$).

The block of data encoded with the product code is typically transmitted as a serial block of encoded data. Product codes typically exhibit optimum performance with respect to coding gain when correcting for single one-bit errors when single-bit parity check codes are employed per dimension. Only single, one-bit errors may be detected and corrected because of parity-check cancellation arising from an even number of errors occurring in a row or in a column and parity-check positional ambiguities associated with multiple one-bit errors. For an example of this positional ambiguity in a square, product code matrix with single bit parity check codes, let the first element of the first row be in error, and the second element of the second row be in error (errors along the forward diagonal). Both the first and second row-wise and first and second column-wise parity bits will indicate an error, but they will also indicate an error if the second element of the first row and the first element of the second row is in error (errors in the reverse diagonal). Detection and correction of higher numbers of errors, especially higher numbers of consecutive errors, may add excessive overhead in terms of error detection information (e.g., parity bits), reducing overall system throughput. Errors in data at the receiver may be caused by incorrect decisions of the detection and/or decoding process because of signal degradation. Signal degradation occurs from added random and/or burst noise as the signal passes through the communication channel.

A characteristic of some communication channels is the addition of "bursty" noise. Such noise may corrupt a transmitted signal for a period of time equivalent to the period of several transmitted symbols (either data or encoded data). Bursty noise may cause burst errors in the received data. To minimize the effect of burst errors, many communication systems include an interleaver in the transmitter and a corresponding de-interleaver in the receiver. Interleaving is a mapping $f(*)$ that generally comprises receiving a block of data having BLK values (i.e., BLK is the block length and BLK is an integer greater than one), and rearranging the order of the BLK values in the block. Interleaving may also be employed, for example, to remove non-random sequences of values in a data stream. By interleaving the symbols in a block of data prior to transmission through the channel, the de-interleaving process distributes the burst errors throughout the de-interleaved block.

The term "output channel sample" refers to a sample of encoded data from the transmission channel generated through the sampling process of the receiver. A receiver typically includes a detector to detect the sequence of symbol bits representing the encoded data from the output channel samples. A decoder receives the detected symbol sequence from the detector and decodes the sequence of symbol bits to reconstruct the data. The decoder may be a simple decoder reversing the encoding process, or an iterative decoder that repetitively decodes the data until a predetermined decoding metric, such as a maximum bit-error rate (BER) threshold, is satisfied. The detector and the decoder may each typically employ a partial response, maximum-likelihood (PRML) algorithm (e.g., Viterbi algorithm (VA)), a maximum a posteriori (MAP) algorithm, or a soft-output Viterbi algorithm (SOVA).

These algorithms used by detectors and/or decoders typically determine a maximum-likelihood path through a trellis of states. The path represents a sequence of decisions for symbols corresponding to the received output channel samples. However, in situations where the received signal has low signal-to-noise ratio (SNR), the algorithm may determine an incorrect path through the trellis, thereby generating an incorrect sequence of decisions for a corresponding sequence of output channel samples. Such sequence of errors is commonly termed an "error event" of the detection algorithm. For some error events, the decision for the sequence of received bits may generate a long sequence of errors, which are thus inserted into the detected encoded data prior to decoding. Consequently, the detection algorithms used in a particular implementation are optimized based on channel memory, SNR, and impulse response, and indirectly with respect to dominant error events.

SUMMARY OF THE INVENTION

The present invention relates to encoding a block of data with a product code and interleaving of the values of the encoded block to enhance error detection and correction of the product code. The error correction capability of the product code detects and corrects M-bit errors in an encoded block, M a positive integer. The encoded block is interleaved by applying a mapping to the encoded block based on an error constraint ER, ER a positive integer that is greater than or equal to M. Errors may be added to the interleaved and encoded data after transmission through a communication channel by, for example, burst noise or from an error event in the detection process. The mapping of the interleaving process is selected to distribute a sequence of up to ER errors throughout a de-interleaved block of encoded data as one or more M-bit errors, and position the one or more M-bit errors uniquely along a path through the B-dimensional matrix after de-interleaving. For the example of a two-dimensional product code detecting and correcting single-bit error, the values of the up to ER errors are distributed so no two of the ER error values are in the same row or column after the interleaved, encoded data block received from a channel is de-interleaved. In addition, the values of the up to ER errors are distributed so the one or more M-bit errors are uniquely positioned along, e.g., the forward or reverse diagonals of the matrix to reduce or prevent positional ambiguities associated with the parity check code bits. Consequently, combining the product code and interleaving process may allow for detection and correction of a greater number of bit errors in received data than when only the error correction capability of the product code is employed. Detection and correction of bit errors is enhanced since the decoding process has a priori information referring to the position of distributed M-bit errors, if present, in the encoded block.

In accordance with one exemplary embodiment of the present invention, a block of data is encoded to enable error detection and correction after passing as a signal through a communications channel. The block of data is encoded with a B-dimensional product code to generate an encoded block, B a positive integer greater than 1, wherein the product code encodes the block of data with error correction and detection information having an M-bit error correction capability, M a positive integer. The elements of the encoded block are interleaved according to an interleaving depth. The interleaving depth is selected based on an error constraint ER and the M-bit error correction capability to provide a predefined distance between, and unique position of, adjacent elements of up to ER errors in the interleaved encoded block when it is de-interleaved, ER a positive integer greater than or equal to M.

In accordance with another exemplary embodiment of the present invention, an interleaved, encoded block of data is detected and decoded after passing as a signal through a communications channel. The block of data is encoded with a B-dimensional product code to generate the encoded block, B a positive integer greater than 1, and the block of data is encoded with the B-dimensional product code that includes error correction and detection information having an M-bit error correction capability, M a positive integer. The set of values are interleaved in accordance with an interleaving depth, the interleaving depth selected based on an error constraint ER and the M-bit error correction capability to provide a predefined distance between, and unique position of, adjacent elements of up to ER errors in the interleaved encoded block when it is de-interleaved, ER a positive integer greater than or equal to M. The interleaved, encoded block of data is detected from the communications channel and either 1) de-interleaved after detection or 2) decoded in accordance with the product code and de-interleaved after decoding to generate output values. The error correction and detection information is employed to correct, in accordance with the M-bit error correction capability and the unique position of the adjacent elements after de-interleaving, each M-bit error in the output values after de-interleaving.

BRIEF DESCRIPTION OF THE DRAWINGS

Other aspects, features, and advantages of the present invention will become more fully apparent from the following detailed description, the appended claims, and the accompanying drawings in which:

FIG. 1 is a flowchart of the encoding and decoding process in accordance with an exemplary embodiment of the present invention;

FIG. 2 shows a one-bit parity check code employed by a two-dimensional product code for encoding of data prior to interleaving in accordance with an exemplary embodiment of the present invention;

FIG. 3 shows the product code encoded data of FIG. 2 after interleaving in accordance with an exemplary embodiment of the present invention;

DETAILED DESCRIPTION

Figure 4:
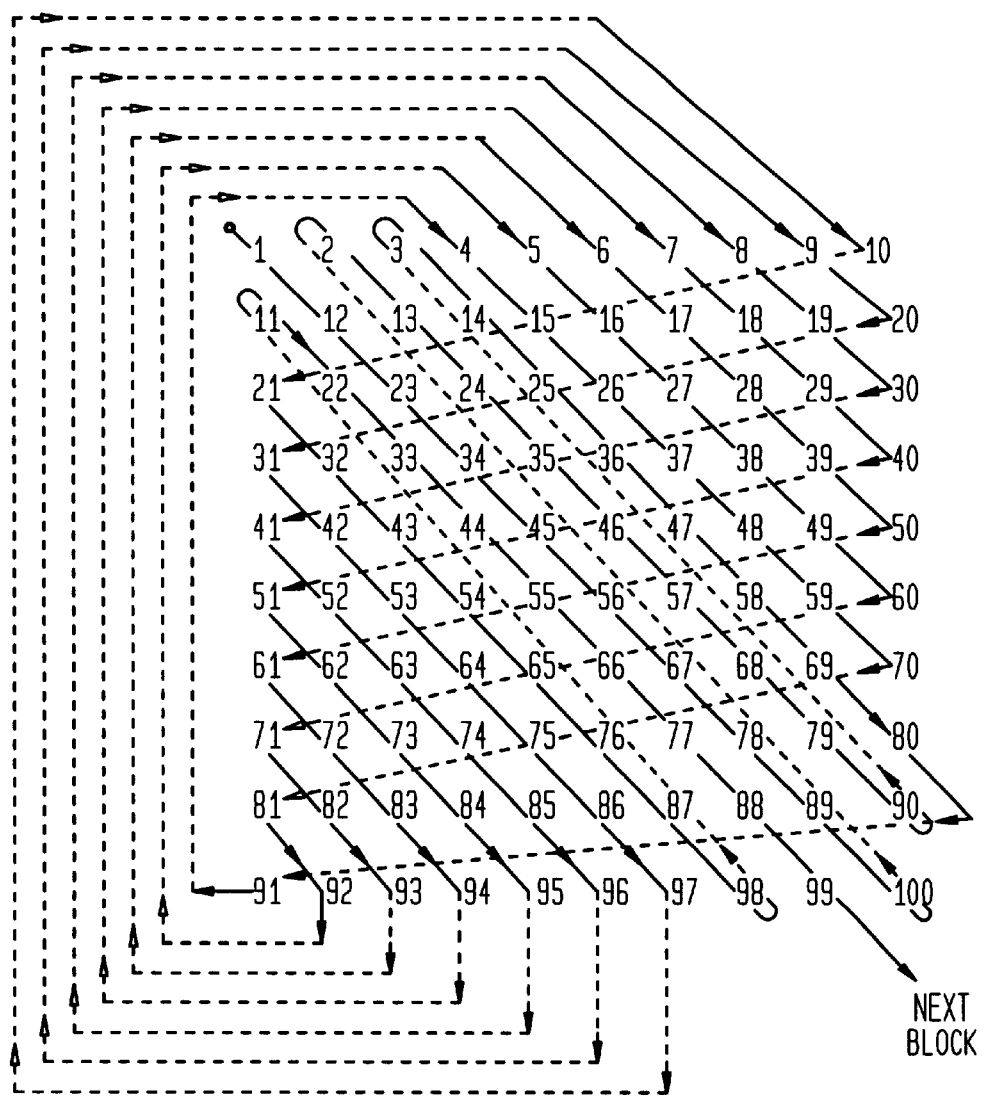
FIG. 4 illustrates.the distribution of an error burst inserted into an interleaved and encoded block such as illustrated in FIG. 3 after de-interleaving by a receiver.

In accordance with exemplary embodiments of the present invention, a product code and interleaving/de-interleaving process are designed to work in combination to enhance the error detection and correction of the product code. Enhancing the error detection and correction of the product code does not require a priori information of channel impulse response or dominant error events of a detector's algorithm (e.g., a maximum-likelihood algorithm that is optimized for a given channel response). Enhancing the error detection and correction of the product code is accomplished by avoiding parity check cancellations by even numbers of errors per dimension and resolving parity check positional ambiguities through interleaving based on 1) a error constraint ER and 2) the error correction capability of the product code itself. De-interleaving an interleaved, encoded block positions adjacent elements of the interleaved, encoded block into unique positions along a predefined direction of the de-interleaved, encoded block, allowing for resolution of parity check positional ambiguities.

The error constraint ER is a maximum number of values in error in the detected decisions for a number of received output channel samples corresponding to an encoded block.

Error constraint ER may be a burst error constraint, such as a maximum number of errors introduced by burst noise in the communication channel, or may be an error event constraint, such as the maximum-length error event generated by an incorrect decision of the detector's or decoder's Viterbi algorithm. In preferred embodiments, the error constraint ER may be predefined, and then the block length N is generated from ER. For example, if a Viterbi algorithm has a dominant error event with length of l, where v is the channel memory length and l is generally greater than (v), then ER may be selected as at least this length (ER≧l. If a square, two-dimensional information matrix is used for the block code with each row and column length of n, then n is selected as greater than or equal to ER and the block length N generated is $n^2$.

FIG. 1 is a flowchart of the encoding and decoding process in accordance with an exemplary embodiment of the present invention. At step 101, a block of data of length N is encoded with a product code of B dimensions (e.g., B component codes), N and B both positive integers. The product code of step 101 inserts information into the encoded block that allows for detection and correction of unique single M-bit errors in the encoded block. As used herein, the term "unique" means M-bit errors in which no more than a sequence of M-bit errors may appear in any given dimension, such as no more than one M-bit errors in any column or row for the two-dimensional case. Detection and correction of single M-bit errors per dimension in the encoded block is termed the product code's "error correcting capability", with M a positive integer less than or equal to ER.

At step 102, the encoded block of data is interleaved with an interleaving depth λ based on a error constraint ER and the error correcting capability. Each of the M-bit errors is positioned at unique intersections of the B-dimensions along a predefined direction of the de-interleaved B-dimensional matrix to resolve positional ambiguities of the error correcting capability. For a two-dimensional product code with M=1, the single-bit errors are positioned at unique intersections of rows and columns of the information matrix along a direction, such as a forward or reverse diagonal direction, of the two-dimensional matrix to resolve parity check positional ambiguities. Interleaving is selected to convert the sequence of up to ER errors into one or more M-bit errors distributed through the encoded block after de-interleaving by, for example, the receiver.

At step 103, the interleaved, encoded block of data may be transmitted as a signal through a channel. At step 104, the received signal is sampled as channel output samples and hard decisions are generated for the channel output samples of the interleaved, encoded block. Errors may be added to the encoded and interleaved block by noise effects. Noise effects may be from either random or bursty noise added to the signal in the channel. During the detection or the decoding (e.g., Viterbi detection or decoding) process, the noise effects may cause the detector or decoder to make an incorrect decision for output values (e.g., creating an error event during decoding). At step 105, the sequence of hard decisions representing the either the detected or decoded interleaved, encoded block are de-interleaved. At step 106, the de-interleaved sequence of received values is arranged as a received information matrix, and the error detection and correction information is extracted to identify and correct errors in the encoded block. Such identification employs a priori knowledge of the unique positions of the M-bit errors along a predefined direction of the de-interleaved B-dimensional matrix to resolve positional ambiguities of the error correcting capability.

The sequence of up to ER burst errors is distributed throughout the sequence of received values as one or more single, M-bit errors after de-interleaving, with each M-bit error separated from other M-bit errors by a minimum distance substantially equivalent to the interleaving depth λ. Selection of the interleaving depth is described separately below. Such distance between M-bit errors provides for uniquely identified M-bit errors along each dimension of encoding, thus allowing for error detection and correction of each M-bit error. If more than ER errors are inserted into the encoded block, errors may be detected, but only some of the errors may be corrected depending on their position after de-interleaving. At step 107, each M-bit error is located and corrected based on the error detection and correction information. If de-interleaving occurs after detection, at step 108, the encoded block is then decoded by reversing the encoding process of the product code to provide the reconstructed data.

The present invention is described below for an exemplary embodiment in which a two-dimensional product code with a one-bit parity-check subcode in each dimension is employed to encode a block of data (e.g., provided as a sequence of N bits) arranged as a two-dimensional information matrix. For the square two-dimensional matrix, $n_1=n_2=n$ and $N=n^2$. The one-bit parity check information appends one bit to each column and one bit to each row, and may include a one-bit parity check value at the intersection of the row- and column-wise parity bits, so $k_1=k_2=n+1=k$. The error correction capability of such code is single, one-bit error correction (i.e., M=1). One skilled in the art may readily extend the following described techniques to higher-dimensional product codes (B>2) and higher bit error correction capability (M>1).

Figures 2, 3:
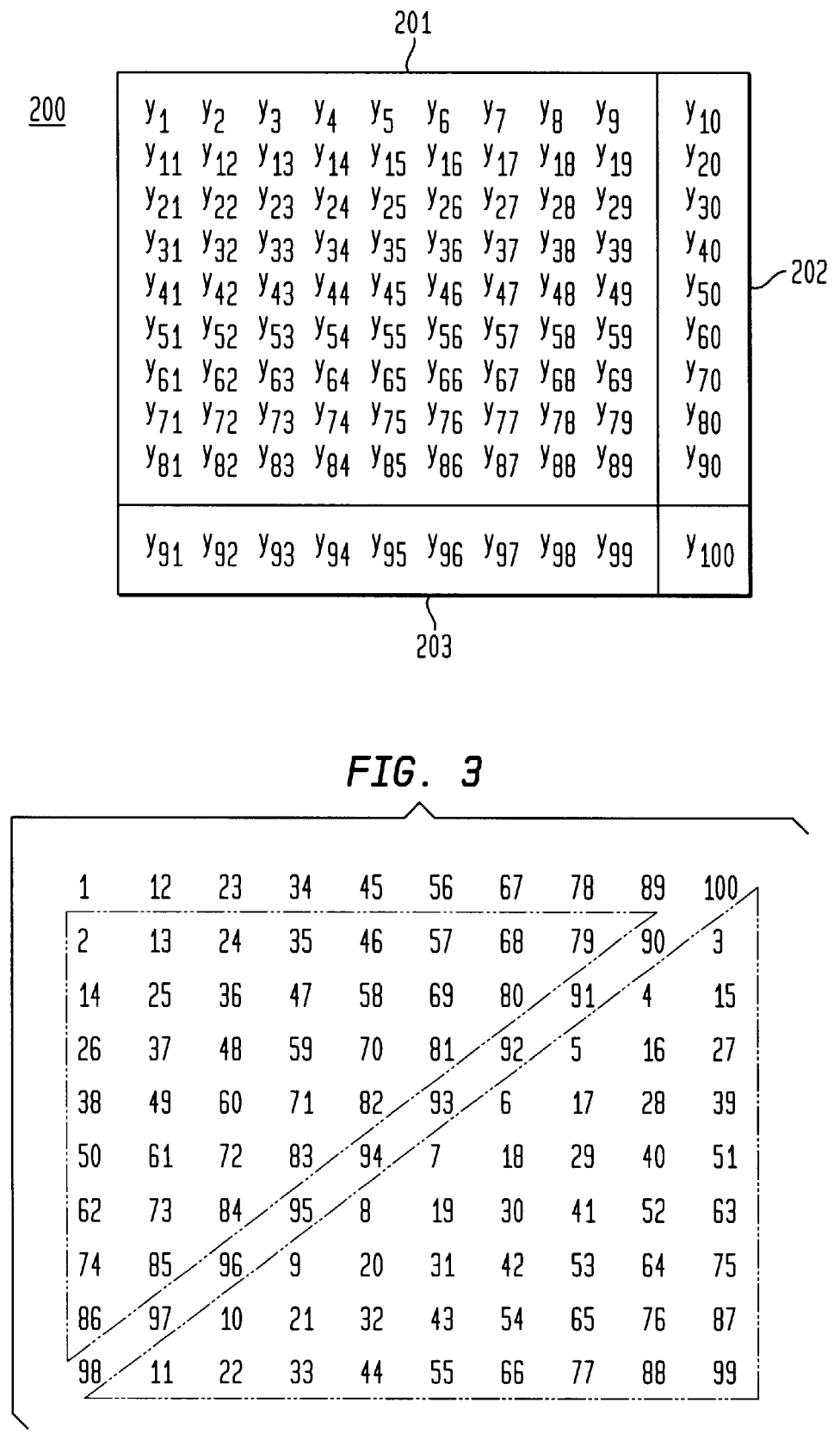

An exemplary product code matrix of values $y_1$–$y_{100}$ is shown in FIG. 2, and the two-dimensional information matrix 200 includes both the encoded data 201 arranged as a square information matrix, and row and column parity check values 202 and 203, respectively. An additional parity bit (shown as value $y_{100}$ in FIG. 2) may be used as a parity check bit for the row and column parity bits. In general, the encoded data block D is given (and may be arranged as) in equation (1):

$$D = \begin{bmatrix} d_1 & d_2 & \cdots & d_n & p_1 \\ d_{n+1} & d_{n+2} & \cdots & d_{2n} & p_2 \\ \cdots & \cdots & \cdots & \cdots & \cdots \\ d_{(n-1)n+1} & d_{(n-1)n+2} & \cdots & d_{n^2} & p_n \\ p_{n+1} & p_{n+2} & \cdots & p_{2n} & p_{2n+11} \end{bmatrix} \quad (1)$$

where the encoded data is $d_1$ through $d_{n^2}$ and row and column parity check values are $p_j$, where $1 \leq j \leq 2n+1$. In equation (1), D is a k by k matrix with rows and columns numbered consecutively.

The error correction capability of the product code before combination with interleaving in accordance with exemplary embodiments of the present invention is as follows. Since the product code uses single parity check for rows and single parity check for columns, error detection of a single-bit error per data block is guaranteed before interleaving. This one-bit parity check product code is capable of correcting the single error per data block that is located at the intersection of the row and column with the corresponding row and column parity-bit check failures. Without interleaving in accordance with the present invention, two-dimensional encoding with the one-bit parity-check product code loses its detecting and correcting capability when more than 1 error (per block) is inserted into the transmitted values because of 1) parity check cancellation when an even number of errors occur per dimension and/or 2) positional ambiguity of errors for more than one row- and column-wise parity bit pair.

Selection of a mapping $f(*)$ for interleaving the encoded data is now described. As is known in the art, interleaving applies a mapping $f(*)$ to a block of values to change the order of the values in the block. Applying the inverse mapping $f^{-1}(*)$ rearranges the interleaved block of values to reconstruct the original block of values. In accordance with embodiments of the present invention, the mapping $f(*)$ is selected so as to distribute (i.e., split up and arrange the positions of) up to ER errors such that the errors may be corrected with the error correction capability of the encoding process. The mapping $f(*)$ is selected to position the up to ER errors along one or more rows of the interleaved encoded block as one-bit errors positioned along a diagonal direction (either forward or reverse diagonals) of the de-interleaved, encoded block. By positioning these one-bit errors at unique positions along a known diagonal direction, the error detection and correction process of a receiver may use this information to resolve positional ambiguities of more than one row- and column-wise parity check bit pair. Thus, the error correcting capability of the product code, when combined with interleaving, supports pairing of row- and column-wise parity bit failures.

For example, in a product code in which the encoded data is a square matrix, a mapping $f(*)$ for interleaving may rearrange the positions of elements along rows of the matrix into positions along diagonals of the matrix. For a linear mapping $f(*)$, an interleaving depth $\lambda$ may be defined as a shift in address index, and is selected as k+1 (i.e., n+2). The address of an element at a given position in the interleaved data is defined in terms of multiples of this shift (i.e., multiples of interleaving depth)) that identify the address of an element of the original matrix for the given position. The mapping process is cyclic: shifted addresses beyond the address of the last position in the original matrix are reduced by the block length to identify the corresponding element for the given position.

For a two-dimensional product code with a one-bit parity check code, M is one and the mapping $f(*)$ interleaves the encoded block of data so that a burst error of up to length ER in an interleaved and encoded block is split into up to ER single-bit errors in the de-interleaved encoded block along a defined diagonal direction of the de-interleaved, encoded block. Each single-bit error is identified by the intersection of the row and column failing the corresponding row- and column-wise parity-bit check. FIG. 3 shows the block of values $y_1$–$y_{100}$ (for clarity, the "y" of the elements is omitted and only the address subscript is shown in FIG. 3) after interleaving in which the mapping $f(*)$ is selected so as to map between row values and diagonal values. For a square k by k matrix, the interleaving depth $\lambda$ is selected as (k+1)=(n+2), and address $a_j$ in the interleaved matrix $D^I$ of the $j^{th}$ element (i.e., $y_j$, $1 \leq j \leq 100$) of the encoded block of data is as given in equation (2):

$$a_j = [1+\lambda(j-1)] \bmod [(k^2-2)+\lambda] \text{ for } 1 \leq j \leq 10)$$

$$a_j = [1+\lambda(j-2)] \bmod [(k^2-2)] \text{ for } 11 \leq j \leq 100), \text{ where,}$$

$$\text{if } a_j = 0 \text{ or } 1, a_j \text{ is set to } a_j + (k^2-2).) \tag{2}$$

Applying this mapping to the matrix of encoded data D given in equation (1), this interleaving depth $\lambda$ yields an interleaved encoded block $D^I$ as in equation (3):

$$D^I = \begin{bmatrix} d_1 & d_{1+\lambda} & d_{1+2\lambda} & d_{1+3\lambda} & \cdots & d_{1+\lambda(n-3)} & d_{1+\lambda(n-2)} & d_{1+\lambda(n-1)} & p_{2n+1} \\ d_2 & d_{2+\lambda} & \cdots & \cdots & \cdots & d_{2+\lambda(n-3)} & d_{2+\lambda(n-2)} & p_n & d_3 \\ d_{3+\lambda} & d_{3+2\lambda} & \cdots & \cdots & \cdots & d_{3+\lambda(n-2)} & p_{n+1} & d_4 & d_{4+\lambda} \\ d_{4+2\lambda} & \cdots & \cdots & \cdots & \cdots & p_{n+2} & d_5 & d_{5+\lambda} & d_{5+2\lambda} \\ \cdots & \cdots & \cdots & \cdots & \cdots & \cdots & \cdots & \cdots & \cdots \\ d_{(n-1)+(n-3)\lambda} & d_{(n-1)+(n-2)\lambda} & p_{2n-3} & d_n & \cdots & \cdots & \cdots & \cdots & d_{(n-2)\lambda-2} \\ d_{n+(n-2)\lambda} & p_{2n-2} & d_{n+1} & d_{(n+1)+\lambda} & \cdots & \cdots & d_{(n-3)\lambda-1} & d_{(n-2)\lambda-1} & d_{(n-1)\lambda-1} \\ p_{2n-1} & d_{n+2} & d_{(n+2)+\lambda} & d_{(n+2)+2\lambda} & \cdots & d_{(n-3)\lambda} & d_{(n-2)\lambda} & d_{(n-1)\lambda} & p_{2n} \end{bmatrix} \tag{3}$$

where, in equation (3), $D^I$ is a k by k matrix with rows and columns are numbered consecutively. For the exemplary embodiment as shown FIG. 3, the elements in a given row of the encoded block are positioned as elements along forward diagonals in the interleaved block. Similarly, when de-interleaved, the rows of the interleaved block $D^I$ are positioned as elements along forward diagonals in the de-interleaved block. The elements are separated in distance equivalent to the interleaving depth $\lambda$ so that, after de-interleaving, the elements of rows are not row- or column-wise aligned.

As would be apparent to one skilled in the art, numerous techniques exist to determine the mapping $f(*)$ between interleaved and de-interleaved encoded blocks of data for a general case of higher dimensional product codes, higher error correction capabilities (e.g., M>1), and/or non-square matrices. For the general case, numerical and exhaustive search techniques may be employed to generate interleaving depth) for a given error constraint ER, and other types of mapping algorithms, linear or non-linear, may also be employed. The processes of interleaving and de-interleaving values of product code encoded data may not necessarily be implemented directly by an interleaving or de-interleaving circuit, but may also be implemented as a mapping included in the encoding and decoding process (which is often itself a mapping process).

The matrix $\hat{D}$ of values for received output channel samples after de-interleaving may correspond to the hard decisions generated by, for example, a Viterbi or other maximum-likelihood detection algorithm in the receiver. FIG. 4 shows the effect of de-interleaving when errors are inserted into an interleaved encoded block of data for the exemplary encoded data shown in FIG. 2 when interleaved as shown in FIG. 3. For clarity, the "y" of the elements is omitted and only address subscripts of the original matrix D are shown in FIG. 4. The data is interleaved in accordance with the exemplary mapping of equation (2) with n=9, k=10, the associated interleaver depth $\lambda$=11, and error constraint ER=9. Beginning with value $y_1$, the arrow leads through diagonal values in the de-interleaved block corresponding to rows in the interleaved encoded block transmitted through the channel. For ER=9, up to 9 errors may occur along the path of an arrow at any given point without creating more than 1 error in any row or column.

For example, let a sequence of nine values be in error beginning at value $y_{97}$ and ending with $Y_{87}$ in row 9 of the interleaved encoded block $D^I$ of FIG. 3. After de-interleaving by the receiver, the errors in the encoded block $\hat{D}$ occur at the following positions: row 10, column 7 ($y_{97}$); row 1, column 10 ($y_{10}$); row 3, column 1 ($y_{21}$); row 4, column 2 ($y_{32}$); row 5, column 3 ($y_{43}$) row 6, column 4 ($y_{54}$) row 7, column 5 ($y_{65}$); row 8, column 6 ($y_{76}$); and row 9, column 7 ($y_{87}$). As shown in FIG. 4, the exemplary product code and interleaving described herein with respect to FIGS. 2 and 3 splits this single, 9-bit error sequence into eight, 1-bit errors in the de-interleaved encoded block $\hat{D}$ with no more than one error in each row or column. Consequently, these bit errors in the reconstructed, encoded data may be corrected for since the position of each error along a diagonal direction is uniquely identified by the parity check subcodes of the product code.

While the present invention is described with respect to a product code generating a square matrix of values, other forms of product code may be employed to generate, in general, a $k_1$ by $k_2$ matrix, from a block of $N=n_1 n_2$ data values and $k_1-n_1$ and $k_2-n_2$ error correction information. In addition, the techniques described herein may be extended to higher dimensions of product codes. As would be apparent to one skilled in the art, other types of encoding and error correction methods may be employed, as well as, for example, different code rates, block lengths, and/or error correction capabilities per dimension. For example, a product code/interleaver may be designed for correcting 1 single error or 1 error event with up to 4 errors for a minimum encoded data block length of 25, with code rate 16/25. Another example is a product code operating on blocks with length 36 bits, correcting up to 6-bit long error events, and code rate 25/36. In general, smaller block lengths have lower probability of the occurrence of multiple error events or multiple burst errors, and consequently smaller probability of miscorrection but with greater relative overhead.

Figure 5:
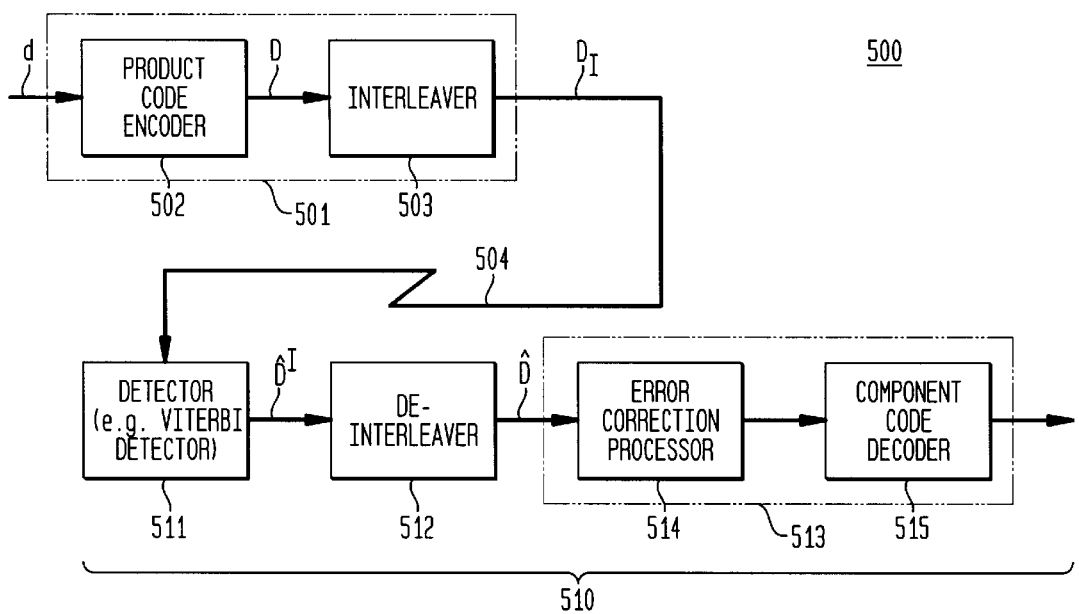
FIG. 5 is a block diagram of an encoding and decoding communication system operating in accordance with an exemplary embodiment of the present invention.

FIG. 5 is a block diagram of an encoding and decoding communication system 500 operating in accordance with an exemplary embodiment of the present invention. The encoding and decoding communication system 500 may be implemented in a magnetic or optical recording systems, or may be implemented between user transceivers in wired, optical, wireless, or cellular communication systems. As would be apparent to one skilled in the art, the implementations of the present invention may be employed to improve system performance in any communication system by providing error detection and correction.

Referring to FIG. 5, transmitter 501 includes product code encoder 502 and interleaver 503. Product code encoder 502 receives blocks d of input data and generates an encoded block $\hat{D}$ for each input block in accordance with a predetermined error detection and correction product code, such as the one-bit parity check two-dimensional product code described above. Interleaver 503 applies a mapping $f(*)$ to each encoded block selected as described previously for the error constraint ER and the error correction capability of the product code. Each interleaved and encoded data block $D^I$ is passed as a signal through a communication channel 504, which may insert random and/or burst noise into the signal, causing errors to be generated during the detection and/or decoding process. The signal is received and sampled by a receiver 510 to generate channel output samples. Receiver 510 includes a detector 511 (e.g., a maximum-likelihood detector employing a Viterbi algorithm), de-interleaver 512, and product-code decoder 513. Product-code decoder 513 may include an error correction processor 514 and one or more component code decoders 515. Detector 511 generates hard decisions for each encoded block from the channel output channel samples, possibly inserting errors. De-interleaver 512 applies the inverse of the mapping $f(*)$ to each encoded block to generate reconstructed encoded data, splitting a sequence of up to ER errors, if present, into one or more M-bit errors. Error correction processor 514 of product code decoder 513 identifies and corrects the M-bit errors in accordance with the error correction information of the product code and a priori information that errors are positioned along a predefined one of the two diagonal directions after de-interleaving. The one or more component code decoders 515 generate the reconstructed data from the error-corrected, encoded block.

Although FIG. 5 shows an exemplary implementation of the present invention for a use with errors inserted either by burst noise or random noise during detection by a sequence detector (e.g., symbol by symbol detection), alternative implementations may be employed for encoding and decoding systems, such as convolutional encoding systems. In such systems, to correct for error events. For such implementations, an alternative implementation may be employed to enhance error correction of error events introduced by the convolutional decoder.

While the exemplary embodiments of the present invention have been described with respect to methods, systems, or processes, the present invention is not so limited. As would be apparent to one skilled in the art, various functions may be implemented in the digital domain, as processing steps in a software program, by digital logic, or in combination of both software and hardware. Such software may be employed in, for example, a digital signal processor, microcontroller or general-purpose computer. Such hardware and software may be embodied within circuits implemented in an integrated circuit.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. In a signal-processing application, a method of encoding a block of data to enable error detection and correction after passing as a signal through a communications channel, the method comprising the steps of:

a) encoding the block of data with a B-dimensional product code to generate an encoded block, B is a positive integer greater than 1, wherein the product code encodes the block of data with error correction and detection information having an M-bit error correction capability, M is a positive integer; and b) interleaving elements of the encoded block according to an interleaving depth, the interleaving depth selected based on an error constraint ER and the M-bit error correction capability to provide a predefined distance between adjacent elements of the interleaved encoded block when it is de-interleaved, ER is a positive integer greater than or equal to M, wherein the predefined distance positions the adjacent elements along a predefined direction of the de-interleaved encoded block so as to allow resolution of positional ambiguities of the M-bit error correction capability.

2. The invention as recited in claim 1, wherein the step of de-interleaving the interleaved encoded block distributes a sequence of up to ER error elements in one dimension of the interleaved encoded block as up to ER single M-bit errors diagonally across the B dimensions after de-interleaving.

3. The invention as recited in claim 1, wherein B is two and step (a) encodes with a two-dimensional block code having a parity check code per dimension as the M-bit error correction capability.

4. The invention as recited in claim 3, wherein the parity check code per dimension as is a one-bit parity check code.

5. The invention as recited in claim 3, wherein the length of each dimension is substantially equivalent to one another.

6. The invention as recited in claim 1, wherein the method is implemented by at least one processor embodied in an integrated circuit.

7. The invention as recited in claim 1, wherein the method is implemented in a processor of an encoder of either 1) a magnetic or optical recording/playback system, or 2) a wired, optical, wireless, or cellular communication system.

8. In a signal-processing application, a method of decoding an interleaved, encoded block of data after passing as a signal through a communications channel, comprising the steps of (a) detecting a set of values representing the interleaved, encoded block of data, wherein the block of data is encoded with a B-dimensional product code to generate the encoded block, B is a positive integer greater than 1, wherein the block of data encoded with the B-dimensional product code includes error correction and detection information having an M-bit error correction capability, M is a positive integer;

(b) de-interleaving the set of values in accordance with an interleaving depth, the interleaving depth selected based on an error constraint ER and the M-bit error correction capability to provide a predefined distance between adjacent elements of the interleaved encoded block when it is de-interleaved, ER is a positive integer greater than or equal to M; and (c) processing the de-interleaved set of values to correct each M-bit error in the set of values using the error correction and detection information in accordance with the M-bit error correction capability, wherein the predefined distance positions the adjacent elements along a predefined direction of the de-interleaved encoded block so as to allow resolution of positional ambiguities of the M-bit error correction capability.

9. The invention as recited in claim 8, wherein, for step (b), de-interleaving the interleaved encoded block distributes a sequence of up to ER error elements in the interleaved encoded block as up to ER single M-bit errors per dimension.

10. The invention as recited in claim 8, wherein B is two and the product code of steps (a) and (d), is a two-dimensional block code having a parity check code per dimension as the M-bit error correction capability.

11. The invention as recited in claim 10, wherein the parity check code per dimension as is a one-bit parity check code.

12. The invention as recited in claim 8, wherein the method is implemented by at least one processor embodied in an integrated circuit.

13. The invention as recited in claim 8, wherein the method is implemented in a processor of a decoder of either 1) a magnetic or optical recording/playback system, or 2) a wired, optical, wireless, or cellular communication system.

14. For a signal-processing application, a circuit having an encoder encoding a block of data allowing for error detection and correction comprising:

an encoder circuit that encodes the block of data with a B-dimensional product code to generate an encoded block, B is a positive integer greater than 1, wherein the product code encodes the block of data with error correction and detection information having an M-bit error correction capability, M is a positive integer; and an interleaver that applies a mapping to elements of the encoded block according to an interleaving depth to generate an interleaved, encoded block, the interleaving depth selected based on an error constraint ER and the M-bit error correction capability to provide a predefined distance between adjacent elements of the interleaved encoded block when it is de-interleaved, ER is a positive integer greater than or equal to M, wherein the predefined distance positions the adjacent elements along a predefined direction of the de-interleaved encoded block so as to allow resolution of positional ambiguities of the M-bit error correction capability.

15. The invention as recited in claim 14, wherein applying the inverse mapping to de-interleave the interleaved, encoded block distributes a sequence of up to ER error elements in one dimension of the interleaved, encoded block as up to ER single M-bit errors diagonally across the B dimensions after de-interleaving.

16. The invention as recited in claim 14, wherein B is two and the product code is a two-dimensional block code having a parity check code per dimension providing the M-bit error correction capability.

17. The invention as recited in claim 16, wherein the parity check code per dimension as is a one-bit parity check code.

18. The invention as recited in claim 16, wherein the length of each dimension is substantially equivalent to one another.

19. The invention as recited in claim 14, wherein the circuit is embodied in an integrated circuit.

20. The invention as recited in claim 14, wherein the circuit is implemented in a transmitter of either 1) a magnetic or optical recording/playback system, or 2) a wired, optical, wireless, or cellular communication system.

21. For a signal-processing application, a circuit having a decoder decoding an interleaved, encoded block of data, comprising:

a detector that detects a set of values representing the interleaved, encoded block of data, wherein the block of data is encoded with a B-dimensional product code to generate the encoded block, B is a positive integer greater than 1, wherein the block of data encoded with the B-dimensional product code includes error correction and detection information having an M-bit error correction capability, M is a positive integer;

a de-interleaver that applies an inverse mapping to de-interleave the set of values in accordance with an interleaving depth, the interleaving depth selected based on an error constraint ER and the M-bit error correction capability to provide a predefined distance between adjacent elements of the interleaved encoded block when it is de-interleaved, ER is a positive integer greater than or equal to M; and an error-correction processor that processes the de-interleaved set of values to correct each M-bit error in the set of values using the error correction and detection information in accordance with the M-bit error correction capability, wherein the predefined distance positions the adjacent elements along a predefined direction of the de-interleaved encoded block so as to allow resolution of positional ambiguities of the M-bit error correction capability.

22. The invention as recited in claim 21, wherein the de-interleaver de-interleaves the interleaved encoded block to distribute a sequence of up to ER error elements in the interleaved encoded block as up to ER single M-bit errors per dimension.

23. The invention as recited in claim 21, wherein B is two and the product code is a two-dimensional block code having a parity check code per dimension providing the M-bit error correction capability.

24. The invention as recited in claim 23, wherein the parity check code per dimension as is a one-bit parity check code.

25. The invention as recited in claim 21, wherein the circuit is embodied in an integrated circuit.

26. The invention as recited in claim 21, wherein the circuit is implemented in a receiver of either 1) a magnetic or optical recording/playback system, or 2) a wired, optical, wireless, or cellular communication system.

27. A computer-readable medium having stored thereon a plurality of instructions, the plurality of instructions including instructions which, when executed by a processor, cause the processor to implement a method for encoding a block of data to enable error detection and correction after passing as a signal through a communications channel, the method comprising the steps of:

a) encoding the block of data with a B-dimensional product code to generate an encoded block, B is a positive integer greater than 1, wherein the product code encodes the block of data with error correction and detection information having an M-bit error correction capability, M is a positive integer; and b) interleaving elements of the encoded block according to an interleaving depth, the interleaving depth selected based on an error constraint ER and the M-bit error correction capability to provide a predefined distance between adjacent elements of the interleaved encoded block when it is de-interleaved, ER is a positive integer greater than or equal to M, wherein the predefined distance positions the adjacent elements along a predefined direction of the de-interleaved encoded block so as to allow resolution of positional ambiguities of the M-bit error correction capability.

28. A computer-readable medium having stored thereon a plurality of instructions, the plurality of instructions including instructions which, when executed by a processor, cause the processor to implement a method for decoding an encoded block of data after passing as a signal through a communications channel, the method comprising the steps of:

(a) detecting a set of values representing the interleaved, encoded block of data, wherein the block of data is encoded with a B-dimensional product code to generate the encoded block, B is a positive integer greater than 1, wherein the block of data encoded with the B-dimensional product code includes error correction and detection information having an M-bit error correction capability, M is a positive integer;

(b) de-interleaving the set of values in accordance with an interleaving depth, the interleaving depth selected based on an error constraint ER and the M-bit error correction capability to provide a predefined distance between adjacent elements of the interleaved encoded block when it is de-interleaved, ER is a positive integer greater than or equal to M; and (c) processing the de-interleaved set of values to correct each M-bit error in the set of values using the error correction and detection information in accordance with the M-bit error correction capability, wherein the predefined distance positions the adjacent elements along a predefined direction of the de-interleaved encoded block so as to allow resolution of positional ambiguities of the M-bit error correction capability.

* * * * *